United States Patent
Yoon et al.

(10) Patent No.: US 10,433,462 B2
(45) Date of Patent: *Oct. 1, 2019

(54) DIGITAL SIGNAGE

(71) Applicant: LG ELECTRONICS INC., Seoul (KR)

(72) Inventors: Donghee Yoon, Pyeongtaek-si (KR); Injae Chin, Pyeongtaek-si (KR); Dongjune Kim, Pyeongtaek-si (KR); Sungwook Han, Pyeongtaek-si (KR); Jiyong Lee, Pyeongtaek-si (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/828,911

(22) Filed: Dec. 1, 2017

(65) Prior Publication Data
US 2018/0084674 A1 Mar. 22, 2018

Related U.S. Application Data

(63) Continuation of application No. 14/042,848, filed on Oct. 1, 2013, now Pat. No. 9,861,007.

(30) Foreign Application Priority Data

Apr. 24, 2013 (KR) ........................ 10-2013-0045175

(51) Int. Cl.
*H05K 7/20* (2006.01)

(52) U.S. Cl.
CPC ....... *H05K 7/20336* (2013.01); *H05K 7/2099* (2013.01); *H05K 7/20136* (2013.01)

(58) Field of Classification Search
CPC .......... H05K 7/20336; H05K 7/20136; H05K 7/2099; H05K 7/202; H05K 7/206; H05K 7/20609; H05K 7/20972; F28F 1/00

(Continued)

(56) References Cited

U.S. PATENT DOCUMENTS 6,519,146 B2 * 2/2003 Nagashima ....... G02F 1/133385
165/104.33
6,697,253 B2 2/2004 Minamitani et al.
(Continued)

FOREIGN PATENT DOCUMENTS

CN 102024422 4/2011
CN 102163584 8/2011
(Continued)

OTHER PUBLICATIONS

Su, Yongjun; Jian Zhouyu, "Electronic Device", Aug. 24, 2011, Suzhou Qisda Dentsu Co Ltd; Disda Corp, Entire Document Translation of CN 102163584—Original Copy provided in Parent Case 14042848) (Year: 2011).*

(Continued)

*Primary Examiner* — Anatoly Vortman
*Assistant Examiner* — Stephen S Sul
(74) *Attorney, Agent, or Firm* — Ked & Associates, LLP

(57) ABSTRACT

There is disclosed a digital signage including a display panel, a housing having the display panel arranged in one surface, the housing comprising a closed inner space, a cooling unit provided in a predetermined portion of the housing, the cooling unit comprising a hole configured to suck and exhaust external air, a heat pipe comprising one end positioned in the inner space of the housing to be coupled to a back surface of the display and the other end positioned in the cooling unit, with a liquid flowing therein to move heat, and a driving circuit board coupled to a back surface of the heat pipe to control driving of the display panel, such that the digital signage having a slim design can exhaust the heat generated from a display panel and a driving circuit board effectively.

18 Claims, 7 Drawing Sheets

(58) Field of Classification Search
USPC .......... 361/697, 700, 679.47, 702, 703, 701, 361/709, 711, 718–722
See application file for complete search history.

(56) References Cited

U.S. PATENT DOCUMENTS

| | | | |
|---|---|---|---|
| 6,724,624 | B1 | 4/2004 | Dodson |
| 2002/0075646 | A1 | 6/2002 | Minamitani et al. |
| 2002/0083716 | A1* | 7/2002 | Ko .................. F04D 29/582 62/3.7 |
| 2003/0132710 | A1 | 7/2003 | Kim |
| 2006/0181670 | A1 | 8/2006 | Kurokawa et al. |
| 2007/0242438 | A1 | 10/2007 | Belits et al. |
| 2010/0061052 | A1 | 3/2010 | Chung |
| 2010/0142149 | A1 | 6/2010 | Nakamichi et al. |
| 2010/0175852 | A1 | 7/2010 | Peterson |
| 2010/0328877 | A1 | 12/2010 | Wicks |
| 2011/0051369 | A1* | 3/2011 | Takahara .......... H05K 7/20972 361/696 |
| 2011/0114294 | A1* | 5/2011 | Degner ............ H01L 23/4006 165/104.26 |
| 2011/0222237 | A1* | 9/2011 | Fujiwara .............. G06F 1/203 361/679.48 |
| 2011/0304979 | A1 | 12/2011 | Peterson et al. |
| 2012/0188724 | A1 | 7/2012 | Masaki |
| 2013/0269907 | A1* | 10/2013 | Fetcu ................ F28D 15/02 165/11.1 |
| 2013/0294030 | A1 | 11/2013 | Wang et al. |
| 2014/0009882 | A1 | 1/2014 | Cox et al. |
| 2014/0036440 | A1* | 2/2014 | Inoue .................. H01L 23/467 361/692 |

FOREIGN PATENT DOCUMENTS

| | | |
|---|---|---|
| CN | 103684646 | 3/2014 |
| JP | H 10-301498 | 11/1998 |

OTHER PUBLICATIONS

Acetone, 1998, U.S. Secretary of Commerce, NIST Standard Reference Database 79: Quantitative Infrared Database, p. 3.
U.S. Office Action dated Dec. 31, 2015 issued in co-pending U.S. Appl. No. 14/042,848.
Chinese Office Action dated Mar. 30, 2016 issued in Application No. 201310556417.1 (with English translation).
U.S. Final Office Action dated Jun. 3, 2016 issued in co-pending U.S. Appl. No. 14/042,848.
Chinese Office Action dated Sep. 28, 2016 issued in Application No. 201310556417.1 (with partial English translation).
U.S. Office Action dated Oct. 17, 2016 issued in co-pending U.S. Appl. No. 14/042,848.
European Search Report dated Feb. 22, 2017 issued in Application No. 13004998.4.
U.S. Final Office Action dated Apr. 7, 2017 issued in co-pending U.S. Appl. No. 14/042,848.
U.S. Notice of Allowance dated Aug. 30, 2017 issued in co-pending U.S. Appl. No. 14/042,848.

* cited by examiner

DIGITAL SIGNAGE

This application is a Continuation Application of prior U.S. patent application Ser. No. 14/042,848 filed Oct. 1, 2013, which claims priority under 35 U.S.C. § 119 to Korean Application No. 10-2013-0045175 filed on Apr. 24, 2013, whose entire disclosures are hereby incorporated by reference.

BACKGROUND OF THE DISCLOSURE

Field of the Disclosure

The present invention relates to a digital signage having a slim design that is able to exhaust the heat generated from a display panel and a driving circuit board effectively.

Discussion of the Related Art

Recently, digital signage that provides various contents and messages via a display panel has been used, not such a hardware media as a signboard and a poster for outdoor advertisement. With rapid development of intelligent digital video devices based on LCDs or LEDs, demands for such digital signage have been increasing recently.

Here, as the size of a display panel is getting increased more and more, there is a disadvantage of increased heat that is generated in a display panel and a driving circuit board. Due to its characteristics, the outdoor advertisement has to operate normally even in high temperature and high humidity circumstances. Accordingly, a digital signage capable of exhausting the heat generated in a display panel and a circuit unit effectively is required.

SUMMARY OF THE DISCLOSURE

An object of the present invention is to a digital signage having a slim design that is able to exhaust the heat generated from a display panel and a driving circuit board effectively.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital signage includes a display panel; a housing having the display panel arranged in one surface, the housing comprising a closed inner space; a cooling unit provided in a predetermined portion of the housing, the cooling unit comprising a hole configured to suck and exhaust external air; a heat pipe comprising one end positioned in the inner space of the housing to be coupled to a back surface of the display and the other end positioned in the cooling unit, with a liquid flowing therein to move heat; and a driving circuit board coupled to a back surface of the heat pipe to control driving of the display panel.

The digital signage may further include a heat radiation member coupled to the other end of the heat pipe to enlarge a contact area with the air penetrating the cooling unit.

The heat radiation member may include a heat suction part comprising one surface in contact with the heat pipe; and a plurality of heat radiation fins projected from the other surface of the heat suction part.

The digital plurality of the heat radiation fins may be formed in a plate shape and spaced apart a predetermined distance from each other in a perpendicular direction to the surface to make surfaces face each other.

The digital signage may further include a cooling fan configured to control air flow to make air flow between the heat radiation fins by drawing external air therein.

The heat radiation member may include at least one of aluminum, copper, gold and silver.

The cooling unit may further include a cooling fan configured to control air flow in the cooling unit to heat-exchange the external air sucked therein with the heat pipe and to exhaust the air after the heat exchange.

The cooling unit may be arranged in a top portion of the housing, more projected toward a rear direction than the housing, and the hole may include a first hole formed in a top or lateral surface of the cooling unit; and a second hole formed in a bottom of the projected portion of the cooling unit.

The cooling unit may be arranged in a top portion of the housing, and the heat pipe may be a long pipe in a vertical direction.

A horizontal cross section of the heat pipe may be rectangular, and the heat pipe may include a long side in contact with the display panel and a short side perpendicular to the display panel.

The liquid filled in the heat pipe may be a volatile liquid.

A boiling point of the volatile liquid may be 40° C. or higher and 70° C. or lower.

The other end of the heat pipe positioned in the cooling unit may have an enlarged surface area.

The other end of the heat pipe may include a plurality of cooling holes configured to penetrate the air drawn into the cooling unit there through.

The digital signage may further include a plurality of micro-passages provided in the heat pipe, in communication with each other.

A plurality of heat pipes may be arranged and the plurality of the heat pipes may include ends or the other ends in communication with each other.

The heat pipe may contact with the driving circuit board at a predetermined position corresponding to an integrated circuit (IC) mounted on the driving circuit board.

The heat pipe may be extended in a vertical direction, penetrating a top portion of the housing and the cooling unit, and the portion of the heat pipe which penetrates the housing and the cooling unit may be treated for water-proof.

The digital signage may further include a sub display panel provided in a back surface of the housing.

An inner space of one housing may be partitioned off into the housing and the cooling unit by a partition wall.

According to at least one of the embodiments described above, the heat generated in the housing can be exhausted effectively, even without drawing the external air into the housing. Accordingly, the durability of the digital signage can be enhanced.

Furthermore, external foreign substances may not be drawn into the closed housing and no filter is provided. Accordingly, it can be simple to repair and maintain the digital signage. In addition, the simple type heat pipe capable of moving the heat upward and downward is used in the digital signage according to the embodiments, not the conventional heat exchanger with complex passages. Accordingly, the thin housing can be realized.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DESCRIPTION OF SPECIFIC EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

Figure 1:
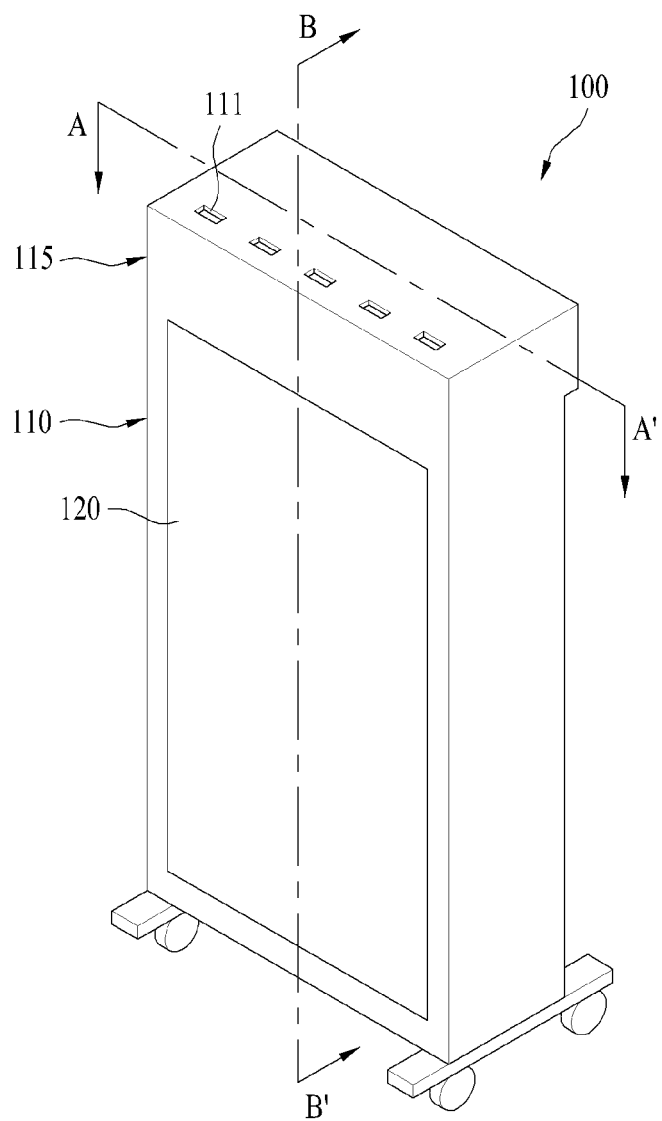
FIG. 1 is a perspective diagram illustrating an exterior appearance of a digital signage according to one embodiment of the present invention.

FIG. 1 is a perspective diagram illustrating an exterior appearance of a digital signage 100 according to one embodiment of the present invention. As shown in FIG. 1, the digital signage 100 includes a display panel 120 arranged on a front surface thereof, a housing 110 having various components arranged therein, and a cooling unit 115 provided in a predetermined portion of the housing 110.

In housing of installing it outdoor, the digital signage 100 could have various foreign substances including dust and sands therein and such foreign substances might deteriorate the durability of the digital signage 100. Accordingly, the inside of the housing 110 is closed airtight to prevent outdoor air from coming therein.

The cooling unit 115 is provided in a predetermined portion of the housing 110 and it includes a hole to suck and exhaust external air therein, different from the housing. The position of the cooling unit 115 may be a lateral surface of the housing. However, when the cooling unit 115 is positioned in a top portion of the housing as shown in FIG. 1, the heat inside the housing 110 can move upward and an effect of heat radiation can be enhanced.

The cooling unit 115 may be attached to the housing independently or a partition wall is provided in one case to partition off the inside of the case into the housing 110 and the cooling unit 115.

The unique technical feature of the embodiments herewith is that the heat generated in the housing 110 is exhausted by the external air circulation of the cooling unit 115. A heat pipe (130, see FIG. 2) is used in transferring the heat inside the housing 110 into the cooling unit 115. Detailed description thereof will be described, referring the drawings herewith.

Figure 2:
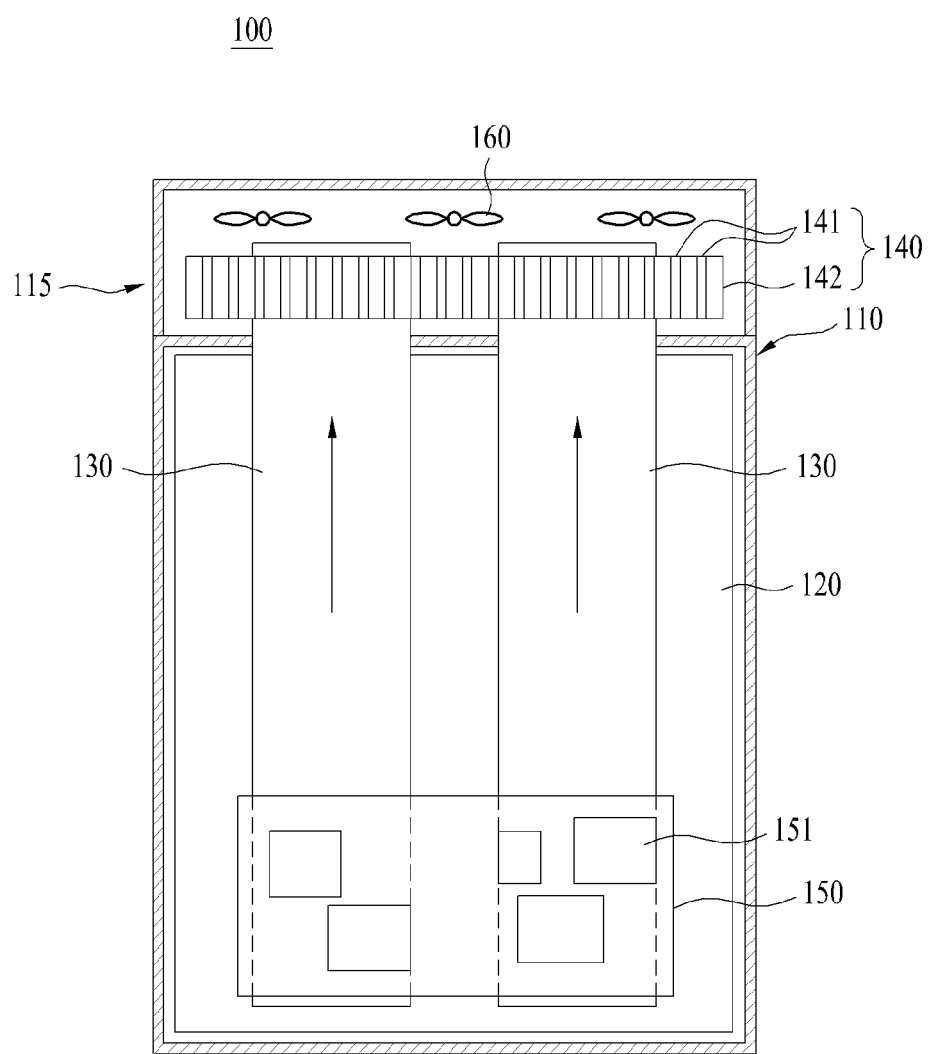
FIG. 2 is a rear diagram illustrating an inside of the digital signage according to one embodiment of the present invention.
Figure 3:
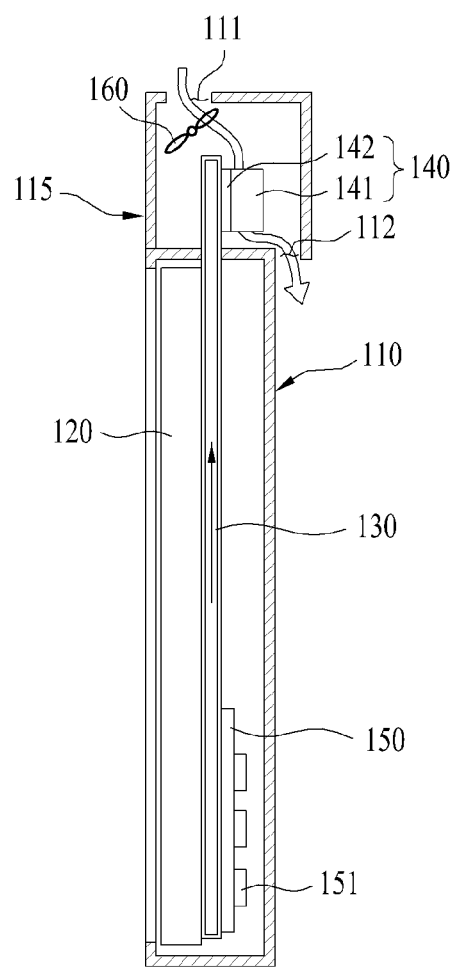
FIG. 3 is a sectional diagram of the digital signage according to one embodiment of the present invention.

FIG. 2 is a sectional diagram of A-A' shown in FIG. 1, more specifically, a rear view illustrating the inside of the digital signage 100 according to one embodiment, cutting back surfaces of the housing 110 and the cooling unit 115 away. FIG. 3 is a side sectional diagram of B-B' shown in FIG. 1.

The display panel 120 and the driving circuit board 150 are arranged in the closed housing 110. The display panel 120 may be insertedly fitted to the front surface of the housing 110. Alternatively, the display panel 120 may be arranged in the closed housing 110 as shown in FIG. 3 and a screen of the display panel 120 may be visible via a front transparent glass provided in the front surface of the housing 110.

The display panel 120 may include at least one of a liquid crystal display (LCD), a thin film transistor-liquid crystal display (TFT LCD), an organic light-emitting diode (OLED), a flexible display and a 3D display.

The display panel 120 realizes a high brightness to secure the visibility even in bright circumstances and the size of the display panel 120 has been getting larger, such that the display panel 120 may generate relatively much heat, compared with a conventional display device. In housing the display panel 120 is overheated, an image quality of the display panel 120 could be affected and it is necessary to radiate the heat exhausted from the display panel 120.

Meanwhile, the driving circuit board 150 configured to control the screen of the display panel 120 includes various circuit elements and applies a voltage signal to realize an image and to supply a power. Such the driving circuit board 150 is electrically connected to the display panel 120 to transfer a driving signal. A cable or a flexible printed circuit that can be flexible or bendable may be used in the electrical connection between the display panel 120 and the driving circuit board 150.

The circuit elements 151 provided in the driving circuit board 150 may include an intelligent power module (IPM) that consumes much power. Once put into operation, such an IPM generates a lot of heat. If the circuit element consuming much power is overheated, it is impossible to stop the operation of the circuit element and it is necessary to radiate the heat generated from the circuit elements 151 effectively.

According to this embodiment, the inner space of the housing 110 is closed airtight to prevent external foreign substances from entering therein and high temperature air inside the housing 110 cannot be exhausted directly. Because of that, the embodiment uses an indirect method that the heat pipe 130 is provided to transfer the heat to the cooling unit 115.

The heat pipe 130 is a closed pipe formed of a metallic material having a high thermal conductivity and filled with a liquid flowing therein. One end of the heat pipe 130 sucks heat and the other end thereof exhausts the heat via air convection of the liquid provided in the heat pipe.

The heat pipe 130 is extended via a top of the housing and a bottom of the cooling unit 115. The portions where the heat pipe 130 passes through may be treated for a water-proof function.

The appearance of the heat pipe 130 is not limited. According to this embodiment, the heat pipe 130 may have a rectangular cross section to enable heat exchange between the heat pipe 130 and both of the display panel 120 and the driving circuit board 150. The heat pipe has a long side that is in contact with the display panel 120 and a relatively short side that is perpendicular to the long side. The display panel 120 is in contact with one side of the rectangular heat pipe 130 and the driving circuit board 150 is in contact with the other opposite side of the rectangular heat pipe 130.

The driving circuit board 150 may be arranged to make a portion where the heat is generated most in contact with the heat pipe. The heat is typically generated in an integrated circuit provided in the driving circuit board 150 most and the portion where the integrated circuit is mounted may be in contact with the heat pipe 130.

According to this embodiment, two heat pipes 130 are provided. However, considering the size or the performance, more than two heat pipes may be provided. In addition, an inner space of the heat pipe 130 may be formed as one integrated space or the inner space may be divided into narrow passages where a small amount of liquid can be vaporized directly right after the liquid is heated to move upward.

The liquid may be a volatile liquid that is phase-changed into a gas at the temperature inside the housing heated by the driving circuit board 150 and returns to the liquid state chilled when the temperature is lowered. Such a volatile liquid may have a boiling point within a range of 40° C. and 70° C.

The liquid filled with the heat pipe 130 sucks the heat from the display panel 120 and the driving circuit board 150 at a predetermined portion (a lower portion, as shown in the drawings) and moves to the other portion (an upper portion, as shown in the drawings). Especially, the volume of the liquid is getting larger and moves upward, once the liquid absorbs the heat. Accordingly, the liquid may move to the cooling unit 115 located in the upper portion from the inner space of the heat pipe 130.

When the heat pipe 130 is formed of a material having a high thermal conductivity, for example, copper (Cu) and silver (Ag), the heat pipe 130 can absorb the heat generated in the display panel 120 and the driving circuit board 150 easily and transfer the heat to the other portion via air convection. Accordingly, the effect of heat radiation may be enhanced.

The heat transferred to the other portion is cooled by the external air drawn into the cooling unit 115. For smooth drawing and exhausting of the external air, the cooling unit 115 may further include a cooling fan 160. The cooling fan 160 blows the air from a first hole 111 toward a second hole 112. The other end of the heat pipe 130 is positioned between the first hole 111 and the second hole 112.

The positions of the holes 111 and 112 may be determined appropriately based on the arrangement of heat radiation fins 141 composing a heat radiation member 140. According to this embodiment, the first hole 111 for sucking air is formed in a top surface and the second hole 112 may be partially projected downward from a back surface of the cooling unit 115 to exhaust the sucked air.

In housing the air is exhausted from the second hole 112 in a lateral or rear direction, the air could be blown to a person located near the digital signage 100. Accordingly, it is preferred that the air is exhausted in a down direction via the second hole 112 formed projected downward. In addition, even if drawn into the cooling unit 115, foreign substances such as rain can be exhausted via the second hole 112.

A heat radiation member 140 may be further provided in the other end of the heat pipe 13 to exhaust the heat generated from the heat pipe more efficiently. The heat radiation member 140 is formed of a material having a high thermal conductivity, for example, copper, silver and aluminum and it can enlarge a surface area to enlarge a contact area with the air penetrating the cooling unit 115.

As shown in FIGS. 2 and 3, the cooling unit 115 may include a heat suction part 142 configured to contact the other end 135 of the heat pipe 130 to suck the heat of the housing 110 transferred along the heat pipe 130 and a heat radiation fin 141 configured to contact the heat with external air to exhaust the heat.

A plurality of heat radiation fins 141 may be spaced apart a predetermined distance from each other to enlarge a contact area. A plurality of cooling fans 160 may be arranged between the spaced heat radiation fins 141 to enable the air to move between the spaced heat radiation fins 141. The heat radiation fin 141 according to this embodiment may be projected downward such that the air may move downward from the top to exhaust the heat via the heat radiation fins 141.

Figure 4:
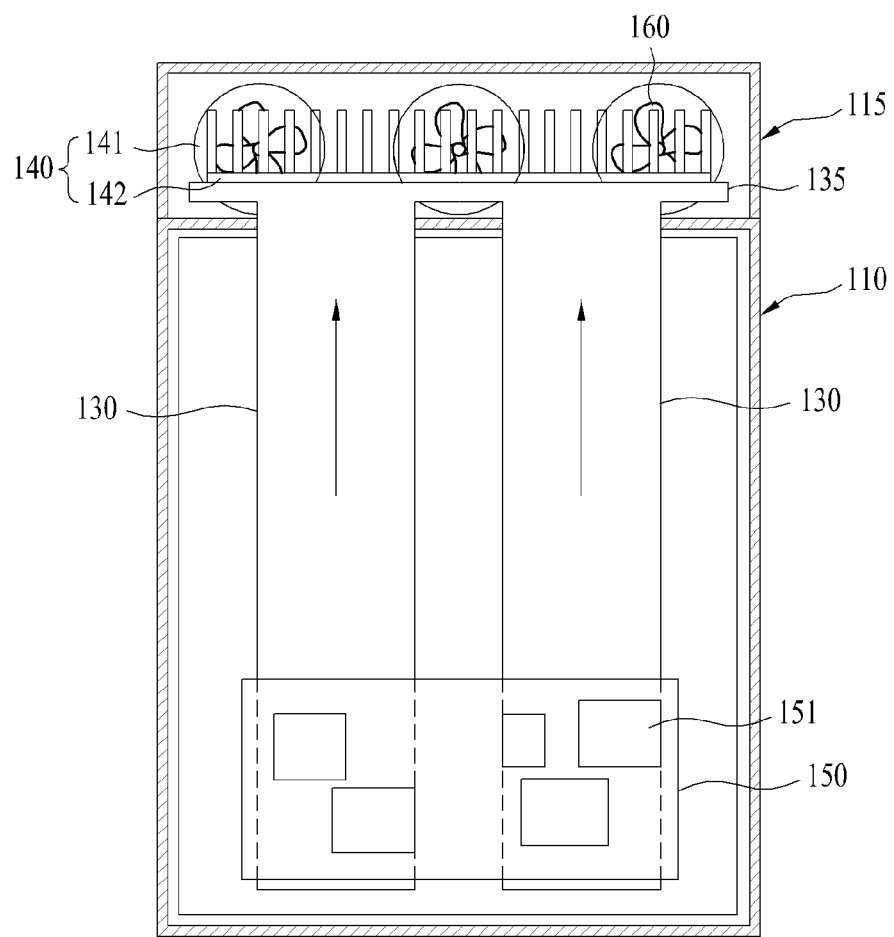
FIG. 4 is a rear diagram illustrating an inside of a digital signage according to another embodiment of the present invention.
Figure 5:
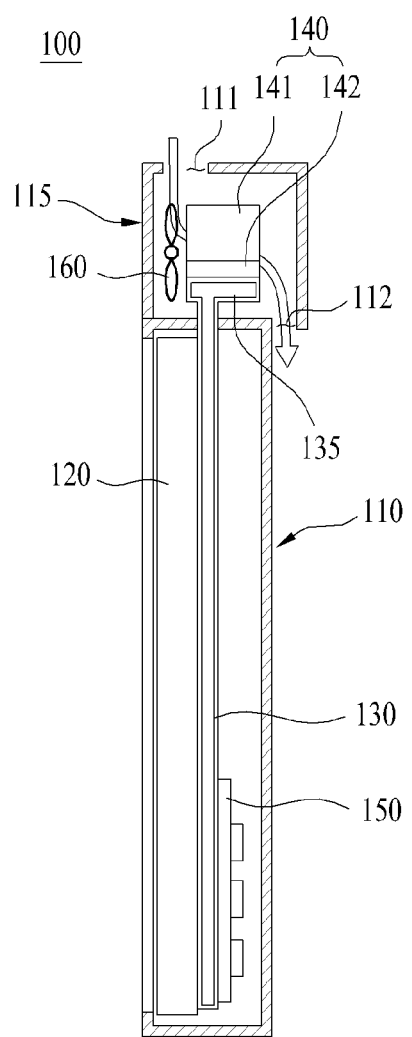
FIG. 5 is a sectional diagram of the digital signage according to the embodiment of FIG. 4.

FIGS. 4 and 5 show another embodiment. FIG. 4 is a rear view illustrating an inner space of a digital signage according to this embodiment and FIG. 5 is a lateral sectional view of this embodiment. Different from the embodiment shown in FIGS. 2 and 3, the heat radiation fins 141 are projected upward and the cooling fans 160 are arranged to blow the air from the front surface toward the back surface of the housing.

The appearance of the other end of the heat pipe 130 may be broad in a horizontal direction to enlarge the contact area with the heat suction part 142 of the heat radiation member 140. In housing of using a plurality of heat pipes 130, the other ends may be in communication with each other and the air can be circulated. Although not shown in the drawings, one ends of the heat pipes positioned in the housing 110 can be in communication with each other and the liquids in the heat pipes can be exchanged with each other.

Figure 6:
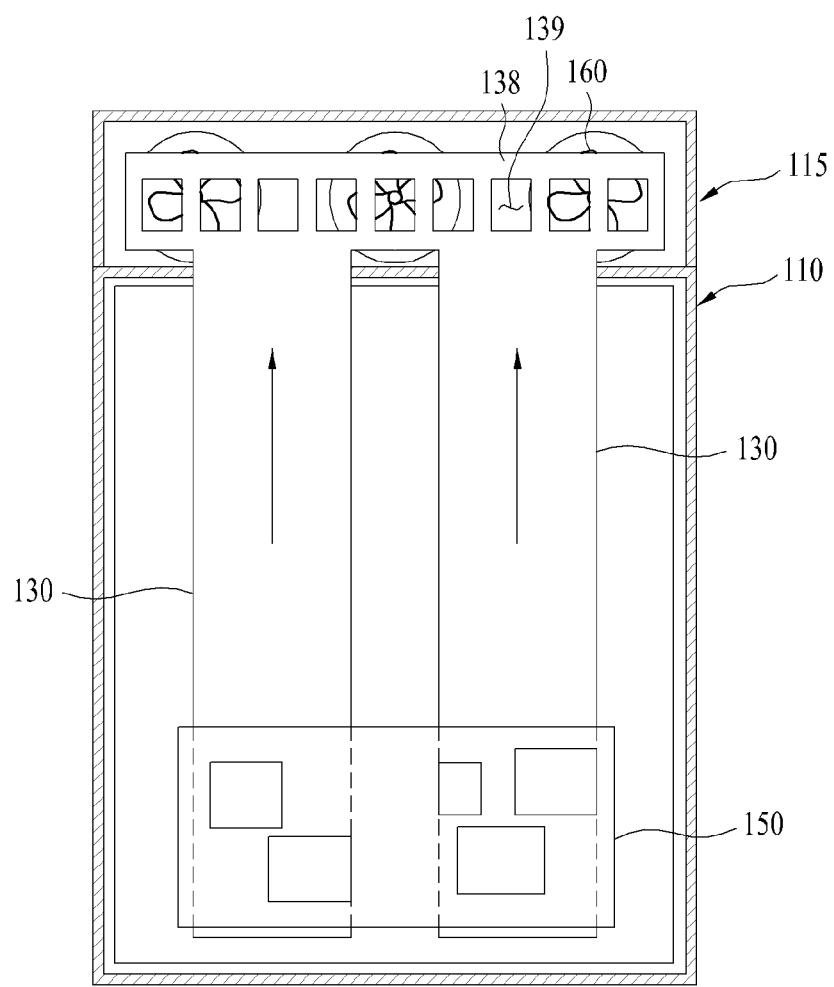
FIG. 6 is a rear diagram illustrating an inside of a digital signage according to a further embodiment of the present invention.
Figure 7:
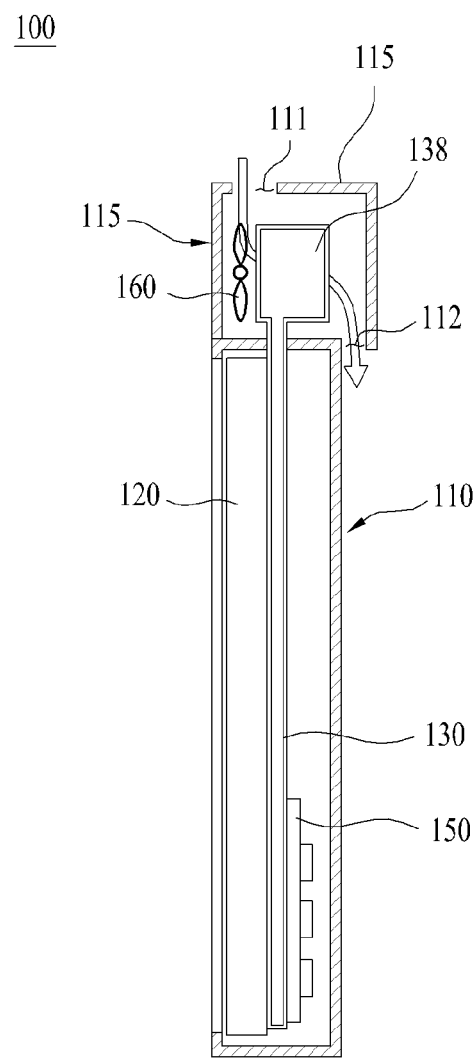
FIG. 7 is a FIG. 5 is a sectional diagram of the digital signage according to the embodiment of FIG. 6.

FIGS. 6 and 7 show a further embodiment of the present invention. FIG. 6 is a rear view illustrating an inner space of a digital signage according to this embodiment and FIG. 7 is a lateral sectional view of this embodiment. According to the embodiments shown in FIGS. 6 and 7, a surface area of the other end 138 of the heat pump 130 is enlarged to exhaust the heat easily, without using the heat radiation member 140.

A plurality of cooling holes 139 may be formed in the heat pipe to enlarge a contact area with external air penetrating the cooling unit 115. While external air is penetrating the cooling holes 139 of the heat pipe 130, the heat inside the housing 110 transferred via the heat pipe 130 may be exhausted.

It is preferred that many small cooling holes 139 are provided to enlarge the contact area with the air from the other end 138 of the heat pipe. However, if the cooling hole 139 is too small, there could be a problem in the air flow of the cooling unit 115 and the liquid circulation cannot be performed smoothly in the heat pipe 130. The size of the cooling hole 139 may be determined, considering characteristics of the liquid circulating in the heat pipe.

The cooling unit is arranged in the top portion of the housing, with no holes formed in a back side of the housing for cooling. Accordingly, a sub display panel may be further provided in the back surface of the housing and a double-sided digital signage can be realized.

According to at least one of the embodiments described above, the heat generated in the housing 110 can be exhausted effectively, even without drawing the external air into the housing 110. Accordingly, the durability of the digital signage can be enhanced.

Furthermore, external foreign substances may not be drawn into the closed housing and no filter is provided. Accordingly, it can be simple to repair and maintain the digital signage. In addition, the simple type heat pipe capable of moving the heat upward and downward is used in the digital signage according to the embodiments, not the conventional heat exchanger with complex passages. Accordingly, the thin housing 110 can be realized.

When a particular feature, structure, or characteristic is described in connection with any embodiment, it is submitted that it is within the purview of one skilled in the art to affect such feature, structure, or characteristic in connection with other ones of the embodiments. Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A digital signage comprising:
   a housing including a closed inner space;
   a cooling unit provided in a top portion of the housing, the cooling unit including at least one hole configured to suck and exhaust external air;
   a display panel arranged in one surface of the housing,
   a heat pipe including one end positioned in the inner space of the housing to be coupled to a back surface of the display panel and another end positioned in the cooling unit, with a liquid flowing therein to move heat; and
   a driving circuit board coupled to a back surface of the heat pipe to control operating of the display panel,
   wherein a horizontal cross section of the heat pipe has a rectangular shape having two long sides and two short sides, and wherein one long side of the two long sides directly contacts with the display panel, another long side of the two long sides directly contacts with the driving circuit board, and the two short sides of the heat pipe are perpendicular to the display panel.

2. The digital signage according to claim 1, further comprising:
   a heat radiation member coupled to the other end of the heat pipe to enlarge a contact area with the air penetrating the cooling unit.

3. The digital signage according to claim 2, wherein the heat radiation member includes:
   a heat suction part having one surface in contact with the heat pipe; and
   a plurality of heat radiation fins that project from another surface of the heat suction part.

4. The digital signage according to claim 3, wherein the plurality of the heat radiation fins are formed in a plate shape and spaced apart a predetermined distance from each other in a perpendicular direction to the one surface to make surfaces face each other.

5. The digital signage according to claim 4, further comprising:
   a cooling fan configured to control air flow to make air flow between the heat radiation fins by drawing the external air therein.

6. The digital signage according to claim 2, wherein the heat radiation member includes at least one of aluminum, copper, gold and silver.

7. The digital signage according to claim 1, wherein the cooling unit further includes:
   a cooling fan configured to control air flow in the cooling unit to heat-exchange the external air sucked therein with the heat pipe and to exhaust the air after the heat exchange.

8. The digital signage according to claim 1, wherein the cooling unit is arranged in the top portion of the housing, more projected toward a rear direction than the housing, and
   the at least one hole includes a first hole formed in a top or lateral surface of the cooling unit; and a second hole formed in a bottom of a projected portion of the cooling unit.

9. The digital signage according to claim 1, wherein the cooling unit is arranged in the top portion of the housing, and
   the heat pipe is a long pipe in a vertical direction.

10. The digital signage according to claim 1, wherein the liquid filled in the heat pipe is a volatile liquid.

11. The digital signage according to claim 10, wherein a boiling point of the volatile liquid is 40° C. or higher and 70° C. or lower.

12. The digital signage according to claim 11, wherein the other end of the heat pipe includes a plurality of cooling holes configured to penetrate the air drawn into the cooling unit there through.

13. The digital signage according to claim 1, wherein the other end of the heat pipe positioned in the cooling unit has an enlarged surface area.

14. The digital signage according to claim 1, wherein the heat pipe includes a plurality of heat pipes, and the plurality of the heat pipes include ends in communication with each other.

15. The digital signage according to claim 9, wherein the heat pipe contacts with the driving circuit board at a predetermined position corresponding to an integrated circuit (IC) mounted on the driving circuit board.

16. The digital signage according to claim 1, wherein the heat pipe is extended in a vertical direction, penetrating the top portion of the housing and the cooling unit, and
   a portion of the heat pipe which penetrates the housing and the cooling unit is treated for water-proofing.

17. The digital signage according to claim 1, further comprising:
   a sub display panel provided in a back surface of the housing.

18. The digital signage according to claim 1, wherein an inner space of the housing is partitioned from the cooling unit by a partition wall.

\* \* \* \* \*